United States Patent
Godshalk

(10) Patent No.: US 12,356,532 B2
(45) Date of Patent: Jul. 8, 2025

(54) RF PRECISION HEATING APPARATUSES AND METHODS

(71) Applicant: Redpoint Microwave, LLC, Newberg, OR (US)

(72) Inventor: Edward M. Godshalk, Newberg, OR (US)

(73) Assignee: Redpoint Microwave, LLC, Newberg, OR (US)

( * ) Notice: Subject to any disclaimer, the term of this patent is extended or adjusted under 35 U.S.C. 154(b) by 930 days.

(21) Appl. No.: 17/508,367

(22) Filed: Oct. 22, 2021

(65) Prior Publication Data

US 2022/0132632 A1 Apr. 28, 2022

Related U.S. Application Data

(60) Provisional application No. 63/104,061, filed on Oct. 22, 2020.

(51) Int. Cl.
  *H05B 6/50* (2006.01)
  *G01R 21/01* (2006.01)
  *H01P 5/18* (2006.01)

(52) U.S. Cl.
  CPC .............. *H05B 6/50* (2013.01); *G01R 21/01* (2013.01); *H01P 5/18* (2013.01); *H05B 2206/023* (2013.01)

(58) Field of Classification Search
  None
  See application file for complete search history.

(56) References Cited

U.S. PATENT DOCUMENTS

| | | |
|---|---|---|
| 4,626,767 A | 12/1986 | Clappier et al. |
| 4,745,264 A | 5/1988 | Carter |
| 5,248,866 A | 9/1993 | Tanaka et al. |
| 2007/0250051 A1 | 10/2007 | Gaston et al. |
| 2009/0038369 A1* | 2/2009 | Vondras ............ H05B 6/68 73/23.35 |
| 2015/0351164 A1 | 12/2015 | Wesson et al. |

(Continued)

OTHER PUBLICATIONS

International Search Report and Written Opinion, PCT/US21/56277, Jan. 31, 2022, 16 pgs.

*Primary Examiner* — John J Norton
(74) *Attorney, Agent, or Firm* — Chernoff, Vilhauer, McClung & Stenzel, LLP

(57) ABSTRACT

Apparatuses and methods for rapid heating a load having magnetic material(s). In some embodiments, the apparatus includes a source of radio frequency (RF) signals and a power management assembly that receives the RF signals and that increases or decreases power of the RF signals. The apparatus additionally includes directional coupler(s) that measure power of the RF signals received from the power management assembly and power of the RF signals reflected from the load to the at least one directional coupler. The apparatus further includes a control assembly operable to receive the measured powers, determine a temperature of the load based on the measured powers, and send one or more control signals to the power management assembly instructing the power management assembly to increase or decrease power of the RF signals received from the source of RF signals to maintain the determined temperature of the load at a predetermined temperature.

14 Claims, 9 Drawing Sheets

(56) References Cited

U.S. PATENT DOCUMENTS

| | | |
|---|---|---|
| 2018/0042073 A1* | 2/2018 | Scott ..................... H05B 6/688 |
| 2018/0062605 A1 | 3/2018 | Brounley et al. |
| 2019/0306935 A1 | 10/2019 | Di Martino et al. |
| 2019/0335550 A1 | 10/2019 | Ben-Shmuel et al. |
| 2020/0037664 A1 | 2/2020 | Fursa et al. |
| 2020/0040717 A1 | 2/2020 | Feng et al. |

* cited by examiner

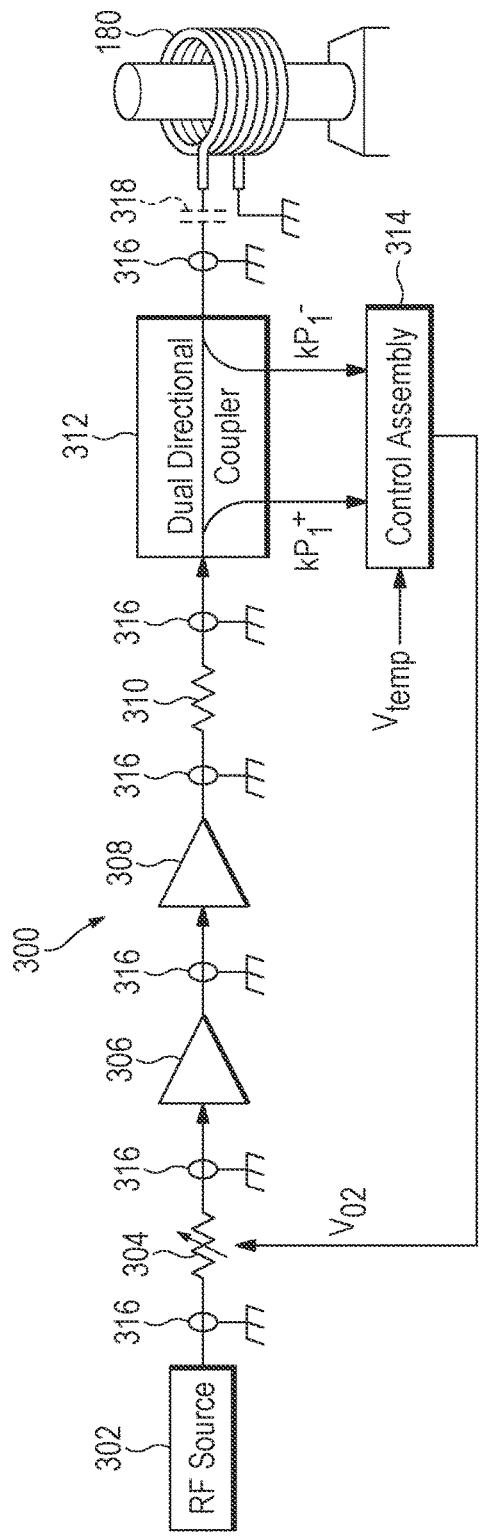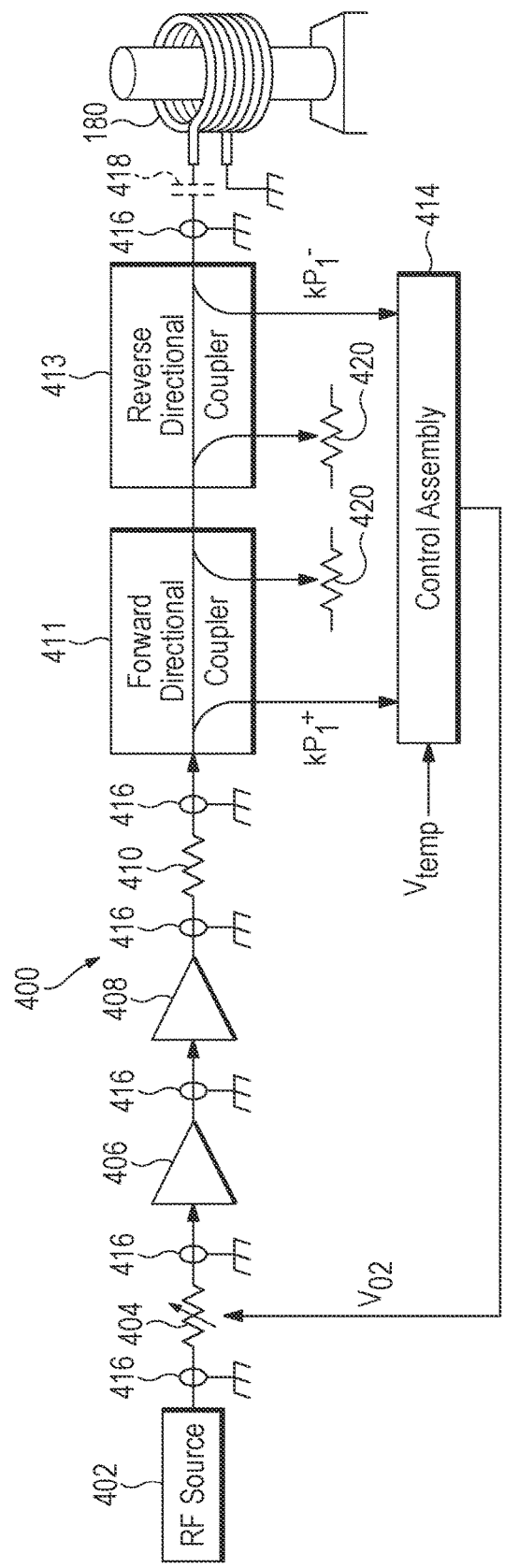
FIG. 4
FIG. 5

RF PRECISION HEATING APPARATUSES AND METHODS

CROSS-REFERENCE TO RELATED APPLICATIONS

This application claims the benefit of U.S. Provisional Patent Application Ser. No. 63/104,061, filed on Oct. 22, 2020 and entitled "RF Precision Heating System." The complete disclosure of the above application is hereby incorporated by reference for all purposes.

BACKGROUND OF THE INVENTION

The present disclosure is directed to apparatuses and methods for rapid heating of magnetic materials using radio frequencies (RF) with the ability to precisely control the operating temperature of the material by measuring, for example, the reflection coefficient—the ratio of the incident (i.e., forward) and reflected (i.e., reverse) voltage. The apparatuses and methods of the present disclosure may be applied in heating die for molding parts, soldering and other industrial manufacturing areas where precision and control of temperature is demanded, such as medical equipment manufacturing and processing.

Magnetic materials undergo a sharp drop in permeability, $u_r$, (and susceptibility, $\chi$, where $\mu_r=1+\chi$) at the Curie point $T_C$, from a relatively high value, such as 50, to a value of approximately 1. Based on this relationship between $u_r$ and $T_C$, specific temperatures can be determined. Around the Curie point transition range, the skin depth $\delta$ of the magnetic material will increase sharply as $\mu_r$ decreases. The Curie point transition range includes the Curie point $T_C$ and can be described as the temperature range in which the magnetic material transitions between ferromagnetic and paramagnetic phases, or in which permeability $u_r$ decreases from about 80% of its initial value until the temperature at which permeability no longer (or no longer significantly) decreases, as shown in the dashed box area of FIG. 1. The Curie point $T_C$ occurs at the temperature where the slope of permeability versus temperature transitions from increasing negative to decreasing negative, which is about 760° C. in FIG. 1. In other words, the Curie point $T_C$ is where the second derivative of the permeability versus temperature goes from negative to positive.

Upon knowing the skin depth and permeability, the inductance of devices utilizing the magnetic material may further be calculated. The skin depth is a function of the frequency, permeability $u_r$, and resistivity $\rho$ of the magnetic material:

$$\text{Skin Depth} = \delta = \sqrt{\frac{\rho}{\pi f \mu}} = \sqrt{\frac{\rho}{\pi f \mu_r \mu_o}}$$

Where,
$\rho$=Resistivity of the Material
f=Frequency
$\mu_r$=Relative Permeability (usually 1)
$\mu_o$=Permeability Constant=$4\pi \times 10^{-7}$ Using the example where the magnetic material is contained in a solenoid (i.e., a wire coiled N turns around a magnetic material core of cylindrical shape), the solenoid may function as a transformer, where the primary winding is the N turns of wire, and the secondary winding is the magnetic material core itself, which can be treated as a single turn conductor in which the current effectively penetrates to a depth $\delta$. The inductance $L_s$ of the solenoid having N turns is a function of the permeability $u_r$, resistivity $\rho$ of the magnetic material, and the number of turns N, length l, and radius R of the solenoid:

$$L_S = (u_o \times u_r \times N^2 \times A)/l$$

Here "A" refers to the effective surface area of the solenoid, typically shown as an annular ring with the outer radius of R and an effective inner radius R–$\delta$. For this geometry:

$$L_S = (u_o \times u_r \times N^2 \times \pi \times (R^2 - (R-\delta)^2))/l$$

This equation shows that as the permeability, $u_r$, decreases at the Curie point there is a net decrease in inductance, $L_S$, since $u_r$ decreases at a faster rate than the skin depth, $\delta$, and associated area, A, increases.

For $\delta<<R$ it can be shown that resistance of this single turn secondary winding is $$R_{secondary} = \rho \times 2\pi \times R/(\delta \times 1).$$

Further, neglecting the conductor resistance of the wire in the primary N-turn winding, the resistance presented to the input terminals of the N turn primary windings of the solenoid is:

$$R_{primary} = R_{secondary}{}^* N^2.$$

A decrease in $u_r$ causes an increase in $\delta$ and so the resistance will decrease at the Curie point.

Aside from inductance, the resistance of the single-turn secondary winding formed by the magnetic material core also decreases measurably in the Curie point transition range. Upon knowing the values of these variables, the impedance (resistance and reactance) of devices, such as inductors, using the magnetic material may then be calculated, and may be used to design rapid heating apparatuses that heat up magnetic materials in the Curie temperature range. The heating apparatuses and methods existing in the prior art have drawbacks because they use sum of the incident and reflected voltage waves, which create a standing wave voltage that is measured to control the temperature of the load after it has heated above the Curie point. Unfortunately, the above approach makes it difficult to control temperature above and below the Curie point for at least the reasons discussed below.

First, the voltage of the standing wave is measured typically at an electrical length of a quarter wavelength from the load because that is where the peak amplitude will occur when the load impedance is at a minimum, which is above the Curie point. Thus, a generally long interconnect is generally required, such as a 6 foot long coax cable, which adds loss to the apparatus and less flexibility as to where the load is placed. Second, the sum of the incident and reflected voltage waves to detect temperature has limited precision in the Curie point transition range where the reflected wave is often small compared to the incident wave because a small change in an already small voltage is hard to detect when added to a large voltage. What is desired, therefore, are rapid heating apparatuses and/or methods that allow improved temperature control over the whole Curie point transition range with no constraint on the interconnect length between the apparatus and the load, all while remaining easy to design and use.

BRIEF DESCRIPTION OF THE SEVERAL DRAWINGS

For a better understanding of the invention, and to show how the same may be carried into effect, reference will now be made, by way of example to the accompanying drawings, which:

FIG. 4 is a block diagram of an example of the RF precision heating apparatus of FIG. 2 showing a dual directional coupler;

Figure 1:
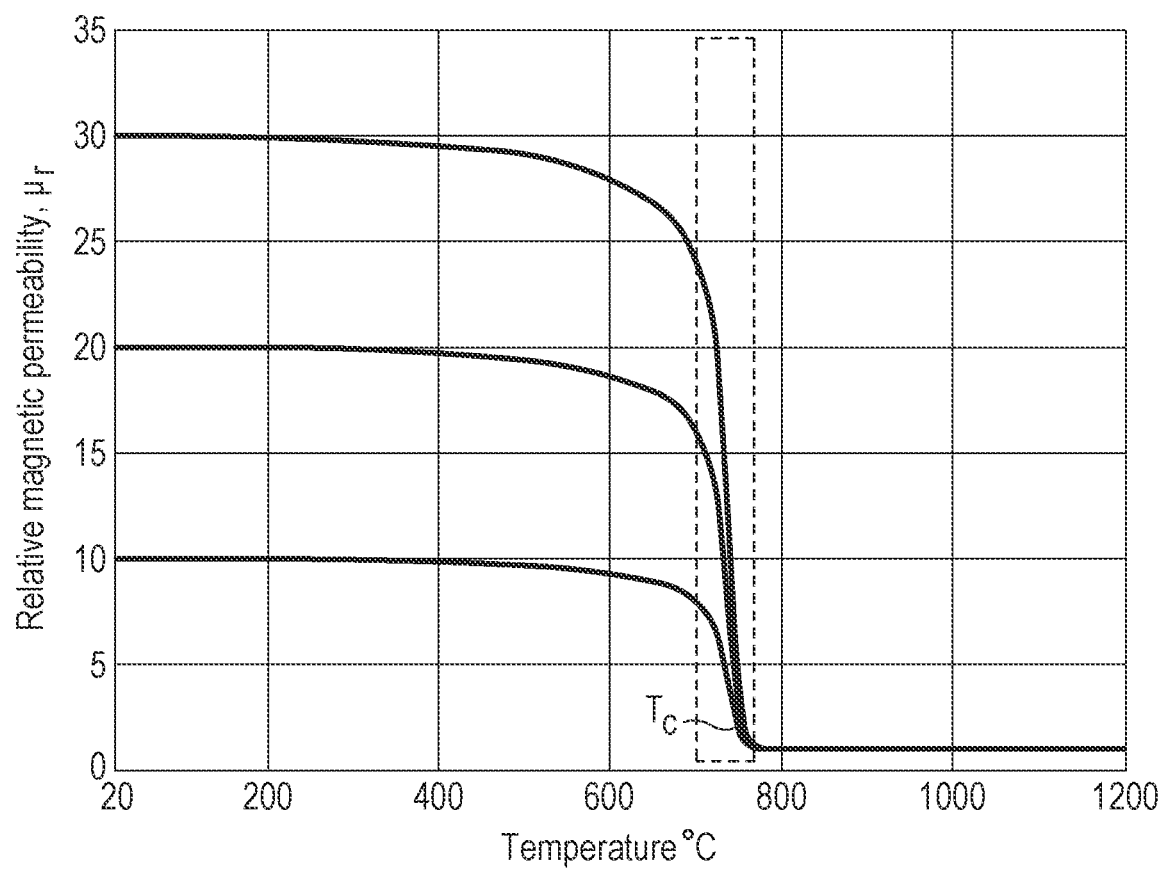
FIG. 1 is a graph of relative magnetic permeability and temperature, showing the Curie point transition range.
Figure 2:
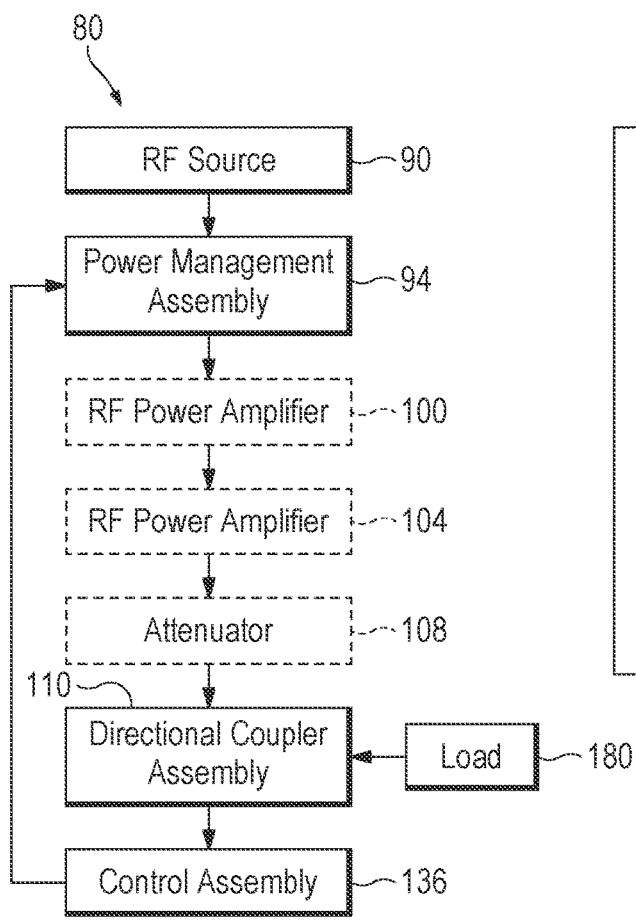
FIG. 2 is a general block diagram of an example of a RF precision heating apparatus of the present disclosure.
Figure 3:
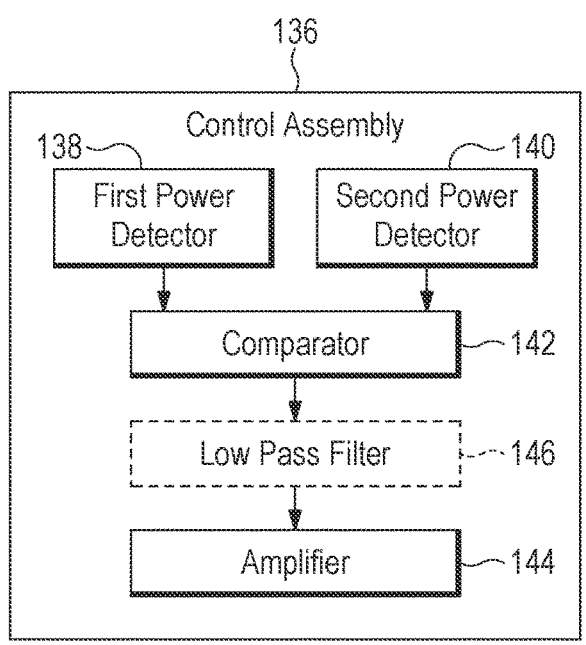
FIG. 3 is a general block diagram of an example of a control assembly of the RF precision heating apparatus of FIG. 2.
Figure 6:
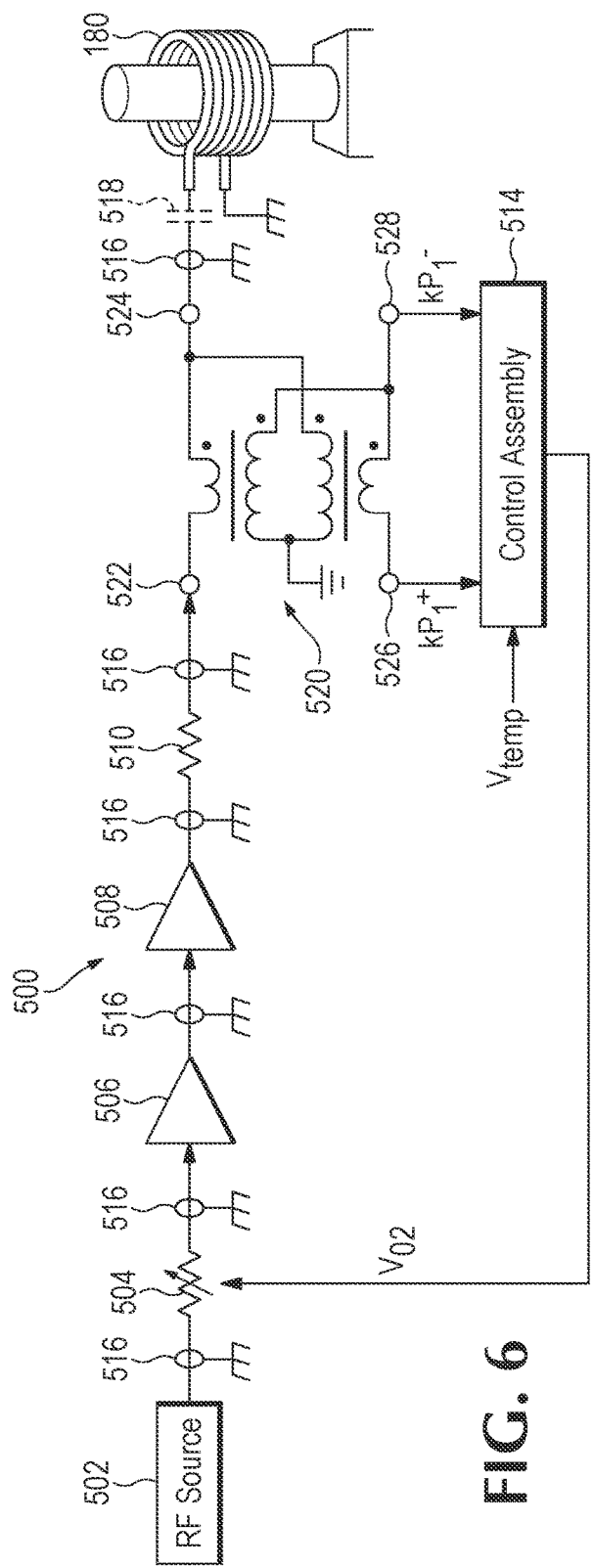
Figure 7:
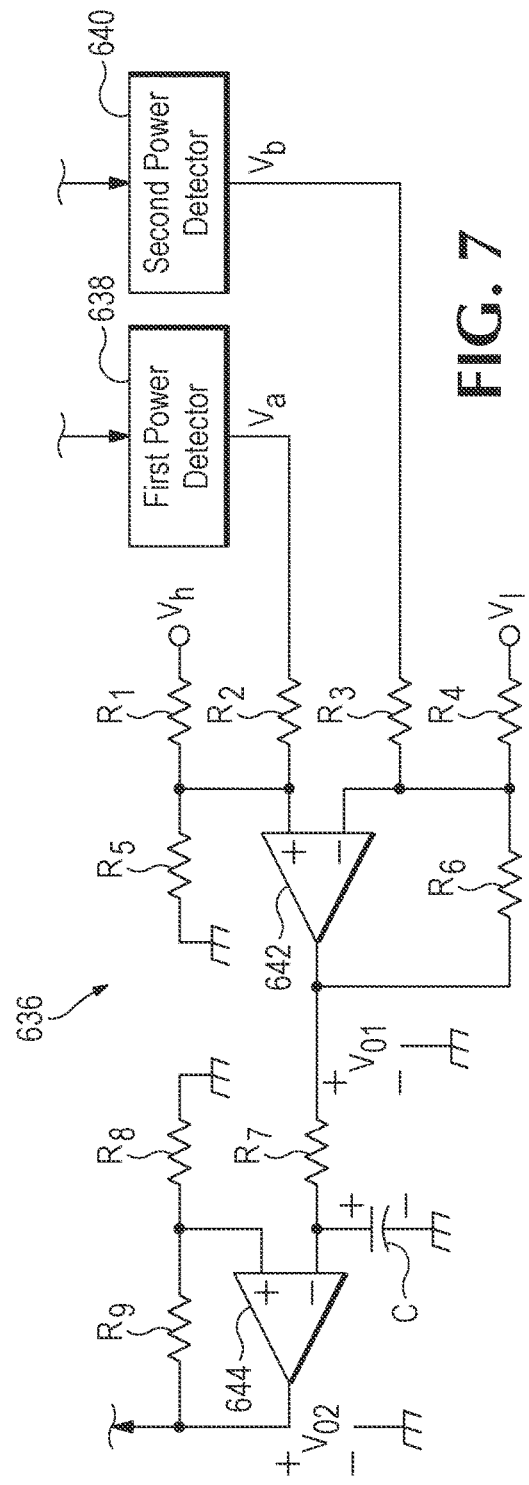
Figure 8:
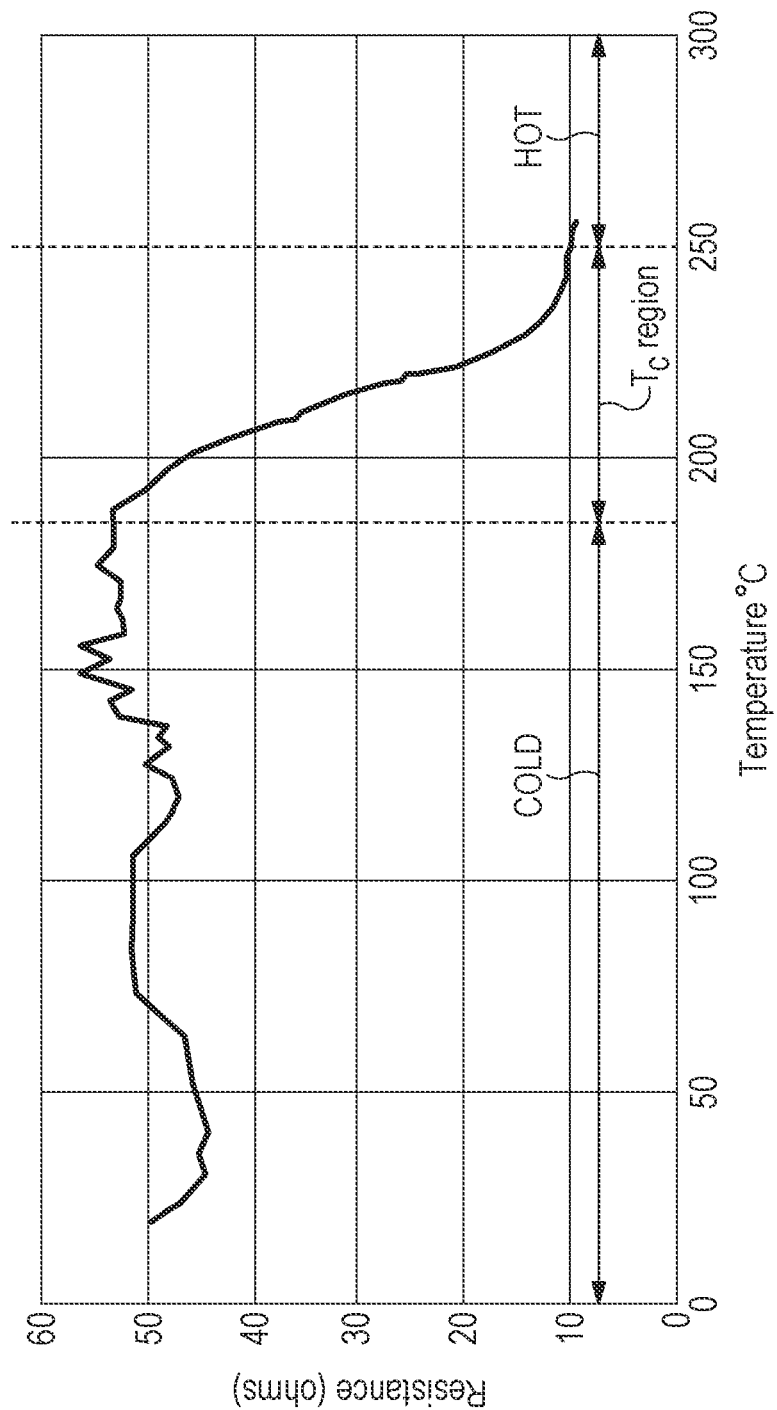
Figure 9:
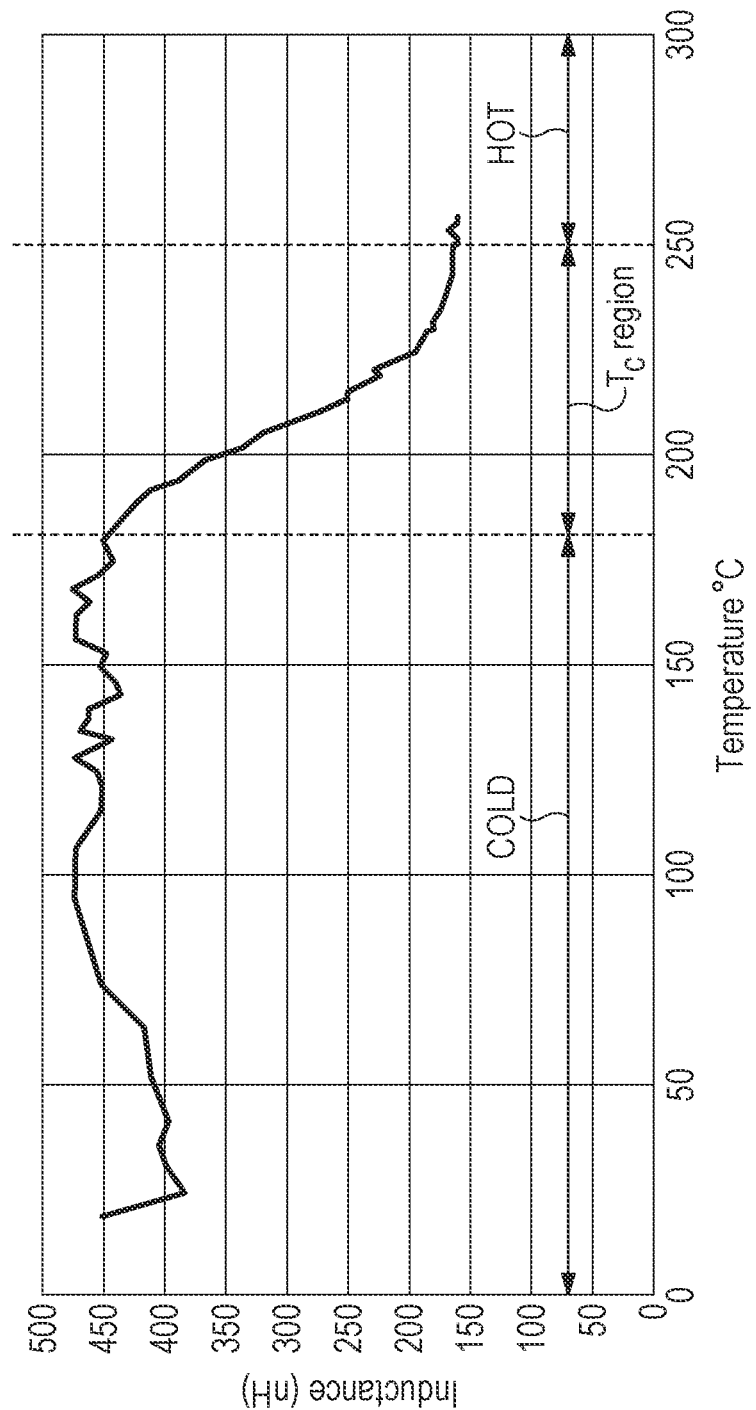
Figure 10:
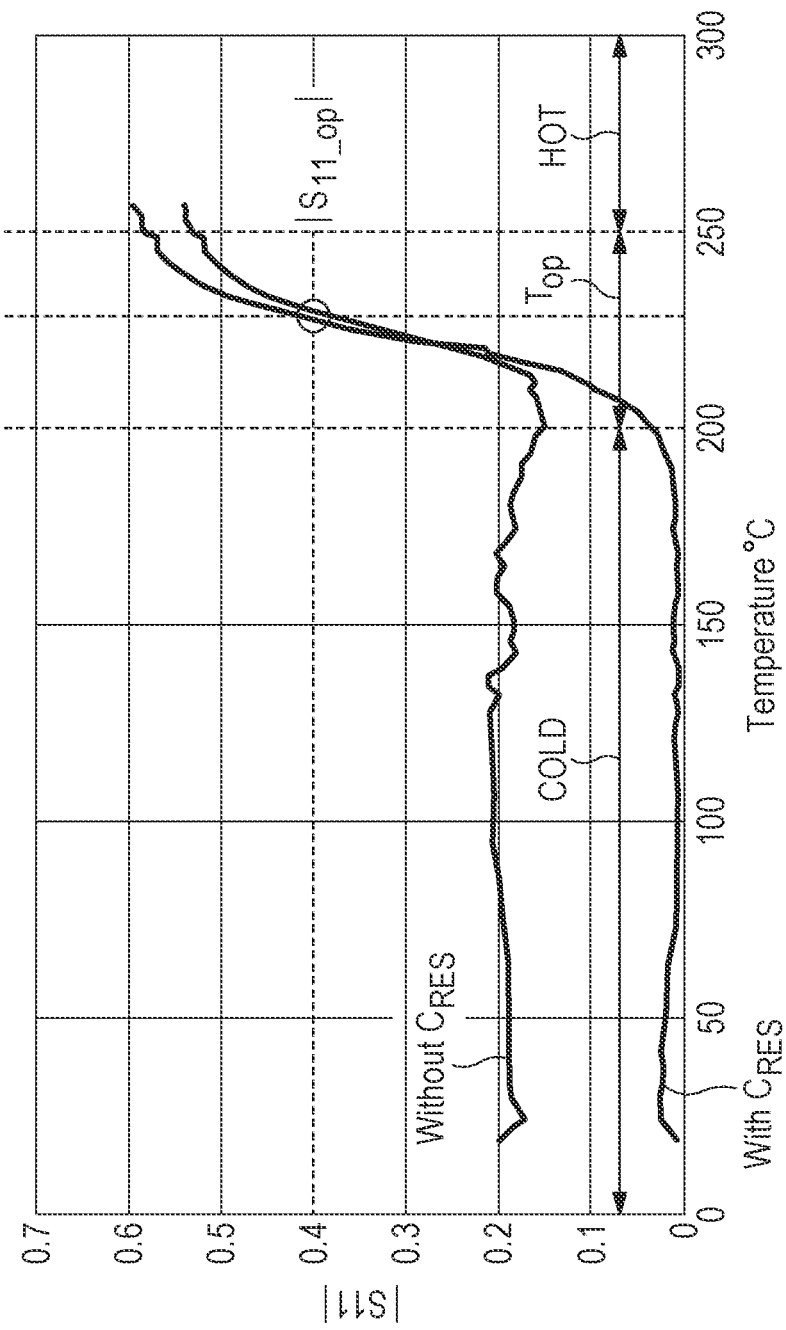
Figure 11:
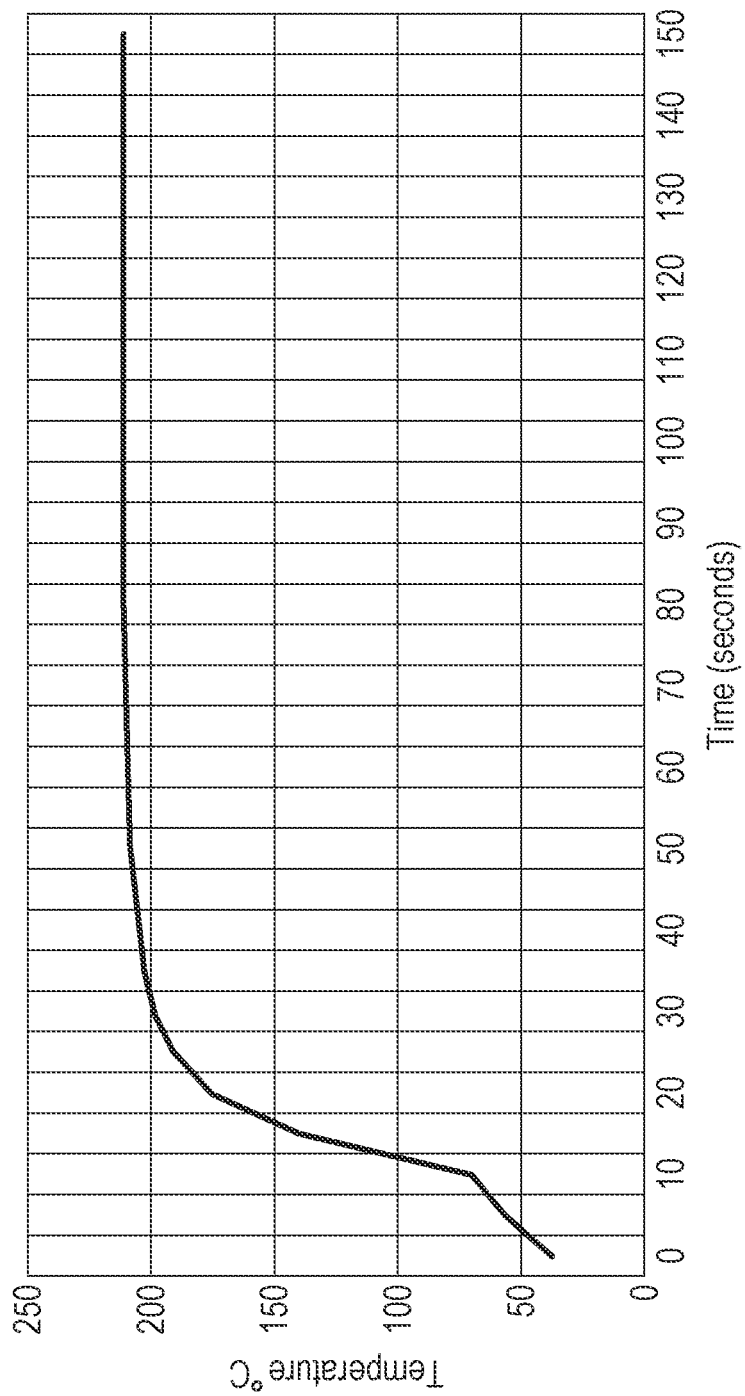
Figure 12:
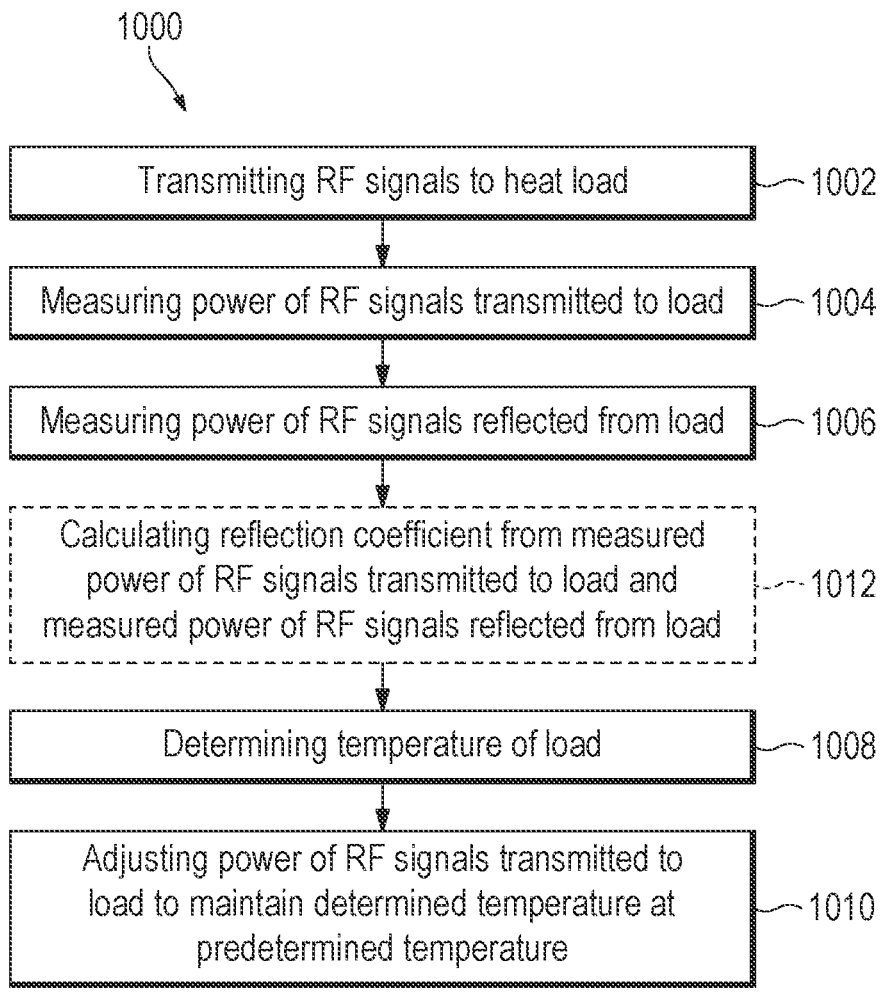

FIG. 5 a block diagram of another example of the RF precision heating apparatus of FIG. 2 showing forward and reverse directional couplers;

FIG. 6 is a block diagram of a further example of the RF precision heating apparatus of FIG. 2 showing a transformer bi-directional coupler;

FIG. 7 is a block diagram of an example of the control assembly of FIG. 3;

FIG. 8 is a graph illustrating load resistance as a function of temperature for an illustrative solenoid of the present disclosure at a currency frequency of 13.56 MHz;

FIG. 9 is a graph illustrating load inductance as a function of temperature for an illustrative solenoid of the present disclosure at a currency frequency of 13.56 MHz;

FIG. 10 is a graph illustrating the reflection coefficient as a function of temperature for an illustrative solenoid load with and without a resonating capacitor;

FIG. 11 is a graph illustrating temperature of the load as a function of time; and FIG. 12 is a flowchart of an example of a process of heating a load having at least one magnetic material via RF signals.

DETAILED DESCRIPTION OF PREFERRED EMBODIMENTS

Referring to FIG. 2, an RF (radio frequency) heating apparatus 80 that may be used to adjust and accurately control temperature of a load 180 in the Curie point transition region is shown. The apparatus 80 successfully does so through, for example, controlling the reflection coefficient of load 180, which has a magnetic material in its core (e.g., a solenoid). In the example shown in FIG. 2, apparatus 80 includes an RF power source 90, a power management assembly 94, a directional coupler assembly 110, and a control assembly 136.

The RF power source 90 supplies RF signals. A typical frequency of the power source is one of the Industrial, Science and Medicine (ISM) frequency bands (i.e. 6.77 MHz, 13.56 MHz, 26.96 MHz, 40.66 MHz, etc.) and typical power output is around 1 mW to 10 mW (0 dBm to 10 dBm). Examples of suitable RF power sources 90 include Kyocera AVX, Fairview Microwave, etc. A band pass filter (not shown) can be used to attenuate harmonics of the RF signals if desired.

Power management assembly 94 is electronically tuned or controlled by control assembly 136, such as based on a control voltage, to decrease or increase power of the RF signals from RF power source 90. The power management assembly may include an attenuator and/or an amplifier. Examples of suitable electronically tunable or controllable attenuators and amplifiers include Mini Circuits MVA-2000+ and Mini Circuits ZFL-1200G+.

Directional coupler assembly 110 samples and/or measures the power of RF signals sent or transmitted to load 180 (also known as the forward or incident power wave $P^+$), and the power of RF signals reflected from load 180 (also known as reverse or reflected power wave $P^-$). In some examples, directional coupler assembly 100 may include separate forward and reverse directional couplers. The forward directional coupler samples and/or measures the power of RF signals sent or transmitted to load 180, while the reverse directional coupler samples and/or measures the power of RF signals reflected from load 180. In other examples, directional coupler assembly 100 includes a dual directional coupler or bi-directional coupler. In further examples, directional coupler assembly 100 includes a transformer bi-directional coupler. Examples of suitable directional couplers include Werlatone C5960-12, Mini Circuits ZABDC50-51HP+, etc.

Control assembly or feedback loop 136 receives the sampled power of RF signals sent or transmitted to load 180 and the sampled power of RF signals reflected from load 180 from directional coupler assembly 110, determines temperature of load 180 based on the above sampled powers, and sends one or more control signals (e.g., control voltages) to power management assembly 94 to increase or decrease power of the RF signals received from RF power source 90 to maintain the determined temperature at a predetermined temperature, such as 200° C. In the example shown in FIG. 2, the control assembly calculates a reflection coefficient from the above sampled powers and sends one or more control signals to power management assembly 94 to increase or decrease power of the RF signals received from RF power source 90 to maintain a reflection coefficient that corresponds to a predetermined temperature. For example, the control assembly may maintain the load at a constant temperature in the Curie point transition range. An example of a suitable control assembly 136 is further discussed below.

Referring to FIG. 3, illustrative components of control assembly 136 are shown. Control assembly 136 includes a first power detector 138, a second power detector 140, a comparator 142, and an amplifier 144. First and second power detectors 138, 140 convert the forward and reverse power waves from directional coupler assembly 110 into voltages $V_a$ and $V_b$, respectively. Comparator 142 compares voltages $V_a$ and $V_b$ and generates an output voltage based on the comparison. Amplifier 144 amplifies the output voltage to a control voltage that will control power management assembly 94 (e.g., to increase or decrease power of the transmitted RF signals from RF source 90). In some examples, control assembly 136 includes a low pass filter 146 that receives output voltage from the comparator to build a "set-point" voltage that is amplified by amplifier 144.

In some examples, RF heating apparatus 80 includes one or more amplifiers, such as shown at 100 and 104, to achieve a desired power of RF signals to heat load 180. For example, desired power levels may be 10 to 1,000 Watts (40 to 60 dBm), but other power levels are certainly possible. Examples of suitable amplifiers include Mini Circuits LZY-22X+, Mini Circuits ZHL-1A-S+, Mini Circuits LHA-13HLN+, etc.

Additionally, or alternatively, RF heating apparatus 80 may include an attenuator 108 disposed between power management assembly 94 and directional coupler 110 (or between RF power amplifier 104, when included, and directional coupler 110). Attenuator 108 serves two purposes. First, attenuator 108 helps to reduce power reflected back into the output of second amplifier 104, which helps prevent potential damage to upstream components, such as amplifier 104, especially when the load possesses a high reflection coefficient (e.g., a short or open circuit). Attenuator 108 absorbs enough of this reflected power to prevent damage to the second amplifier 104, when part of RF heating apparatus 80. Second, attenuator 108 obtains a desired impedance to directional coupler 110. Examples of suitable attenuators include Fairview Microwave SAS2N1007-03.

Referring to FIG. 4, an example of RF heating apparatus 80 is generally indicated at 300. RF heating apparatus 300 includes an RF source 302, an electronically tunable attenuator or amplifier 304, a first amplifier 306, a second amplifier 308, a load attenuator 310, a dual directional coupler 312, a control assembly 314, and a plurality of interconnects 316. The dual directional coupler may also be referred to as a "reflectometer." The dual directional coupler can be microstrip, stripline, coax, waveguide, or other types. Dual directional coupler 312 includes a forward coupled port that samples the incident power and has an output coupling coefficient equal to k. The power output is thus $kP_1^+$. Similarly, a reverse coupled port samples the reverse (or reflected) power wave ($P1^-$), typically having the same coupling coefficient k. The power output is thus $kP_1^-$.

In some examples, RF heating apparatus includes a load capacitor, series capacitor, or resonating capacitor $C_{res}$ 318 to cancel out or at least substantially reduce positive reactance of the inductor, where the reactance of the capacitor is given by:

$$X_C = -1/(2\pi f C_{res})$$

Because $X_C$ is negative, by picking the appropriate value of $C_{res}$ the positive reactance, $X_L$, of the inductance of the load can be cancelled out, decreasing the reflection coefficient to a value close to zero. This is known as series resonance when the reactance is zero.

Referring to FIG. 5, another example of RF heating apparatus 80 is generally indicated at 400. RF heating apparatus 400 is substantially similar to RF heating apparatus 300 except that RF heating apparatus 400 includes a forward directional coupler 411 and a reverse directional coupler 413 instead of a dual directional coupler. The pair of above directional coupler are used to sample the forward and reverse power waves at the coupled ports. The couplers can be microstrip, stripline, coax, waveguide, or other types. The unused isolated port in each of the above directional couplers are terminated in a load impedance 420 having an appropriate characteristic impedance for proper operation. In some examples, RF heating apparatus 400 includes a load capacitor, series capacitor, or resonating capacitor 418.

Referring to FIG. 6, another example of RF heating apparatus 80 is generally indicated at 500. RF heating apparatus 500 is substantially similar to RF heating apparatus 300 and 400 except that RF heating apparatus 500 includes a transformer coupler or transformer bi-directional coupler 520 instead of a dual directional coupler, a forward directional coupler, or a reverse directional coupler. Transformer coupler 520 includes a first or input port 522, a second or transmitted port 524, a third or coupled port 526, and a fourth or isolated port 528. The forward (incident) power wave enters first port 522 and is transmitted to second port 524, and then onto load 180. The forward power wave is sampled at third port 526, which is sometimes called the "coupled port" and fed into control assembly 514. Fourth port 528 is the isolated port for the forward power wave. Similarly, the reverse power wave enters second port 524 and is sampled at fourth port 528 and fed into control assembly 514. One advantage of RF heating apparatus 500 is that it can be used at lower frequencies than conventional directional couplers that are based on transmission line theory. In some examples, RF heating apparatus 500 includes a load capacitor, series capacitor, or resonating capacitor 518.

Interconnects 316, 416, and 516 have a characteristic impedance $Z_0$. The interconnects need not possess identical impedance, but a typical impedance may be around 50 ohms. Load 180 (e.g., a solenoid) has a temperature dependent impedance $Z_L$:

$$Z_L = R_L + j \times X_L$$

where $R_L$ is the resistance and $X_L$ is the reactance. The reactance of the solenoid can be calculated as:

$$X_L = 2\pi \times \text{frequency} \times L_S$$

Generally, if the load impedance is equal to the characteristic impedance $Z_0$ of the apparatus (e.g., the $Z_0$ of the interconnects, directional coupler, attenuators, etc.), then all incident power is absorbed by the load and there is no reflected power. In contrast, when the load impedance is not equal to the characteristic impedance, that means power is being reflected off from load 180, and there is an associated reflected voltage wave $V^-$. The measured ratio of the reflected voltage wave $V^-$ and forward voltage wave $V^+$ of load 180 is called the reflection coefficient, typically represented as $\Gamma$ or $S_{11}$. The reflection coefficient can be calculated as follows:

$$\Gamma = S_{11} = \frac{V_1^-}{V_1^+} = \sqrt{\frac{P_1^-}{P_1^+}}$$

Referring to FIG. 7, an example of control assembly 136 is shown, which is generally indicated at 636. Control assembly 636 includes a first power detector 638 and a second power detector 640, which convert the forward and reverse power waves from directional coupler assembly 110 into incident and reflected voltages ($V_a$ and $V_b$), respectively. Additionally, control assembly 636 includes a first operational amplifier 642 that is configured as a comparator. With all resistor values equal (R1 through R6), the output voltage $V_{o1}$ is given by: $V_{o1}=V_h+V_a-(V_b+V_1)$. Many power detectors have a square-law type response and thus their output voltage is proportional to the detected power. Voltages $V_h$ and $V_1$ are used to start the control assembly from cold temperatures and to set the desired operating temperatures (or predetermined temperatures). Output voltage $V_{o1}$ is fed into a low pass RC filter 646 that is composed of R7 and C as an integrator to build a "set-point" voltage that is amplified by operational amplifier 644 to bring the control assembly into a "locked" condition at the desired temperature via feeding a control voltage $V_{o2}$ into power management assembly 94. Attenuation of power management assembly 94 decreases as control voltage $V_{o2}$ increases. The power management assembly increases its attenuation as control voltage $V_{o2}$ decreases, which lowers the power delivered to the load, which results in the load cooling off and returning to desired operating temperature $T_{op}$. Similarly, if the load begins to cool, the reflection coefficient will decrease and the control assembly will now increase power delivered to the load to increase its temperature back to $T_{op}$.

Control assembly 636 uses magnitude of the incident and reflected voltage (or equivalently the magnitude of corresponding reflection coefficient S11, which is referred to as a "scalar system" because it uses only voltage and does not use phase information. In other embodiments, control assembly 636 includes the relative phase between the incident and reflected waves, which is referred to a "vector system" because it has both amplitude and phase. In further other embodiments (not shown), the control assembly may include analog to digital (A/D) converters to convert the incident and reflected voltages into digital signals. Digital signal processing software can then be used to generate an output voltage $V_{o2}$, to control the power management assembly 94. In some other embodiments, the control assembly may be in the form of a proportional-integral-derivative controller (PID controller or three-term controller) (not shown), where the controller calculates an error value continuously based on the difference between a desired setpoint (SP) and a measured process variable (PV), and then applies a correction based on three control terms, namely proportional, integral and derivative terms.

Referring to FIGS. 8-9, the load resistance and inductance are mapped against temperature for the RF heating apparatuses of the present disclosure used on a solenoid with an INVAR36 core and operating at 13.56 Mhz. Both FIGS. 8-9 show a sharp decrease in both parameters as their core is heated and passes through the Curie point transition region.

Referring to FIG. 10, reflection coefficient of the load varies versus temperature such that the exact temperature can be determined in the transition region about the Curie point because there is a unique value of $S_{11}$ vs. temperature. The magnitude of the reflection coefficient of the example embodiment ranges from 0.2 to 0.53 in the transition region, when the magnetic material in the load passes through the Curie point. In a preferred embodiment, the temperature tuning range is approximately 225 to 250° C. However, different temperature tuning ranges may be used, particularly with other magnetic materials with different Curie temperatures. As discussed, the load has inductance L that has an associated reactance $X_L$. This reactance generally prevents the magnitude reflection coefficient $S_{11}$ from being zero, as indicated in FIG. 10. If the reflection coefficient can be reduced (e.g., close to zero) at cold load temperatures (e.g., below the Curie point), the apparatus may possess greater range of temperature control and in turn offer better performance. As shown in FIG. 10, after adding a series capacitor, $C_{res}$, the change in $S_{11}$ now ranges from about 0.03 to 0.6 over the transition region when the magnetic material passes through the Curie point. An example of $T_{op}$=230 degrees has an associated reflection coefficient magnitude of 0.4.

Referring to FIG. 11, a heating time of 30 seconds is needed for the temperature of the load to increase from 50 to 200 degrees ° C. for a RF heating apparatus with a dual directional coupler, such as shown in FIG. 4.

Referring to FIG. 12, an example of a method 1000 of heating a load having one or more magnetic materials via RF signals is shown. At 1002, RF signals are transmitted from a RF power source to heat the load. At 1004, power of RF signals transmitted to load is measured, such as via one or more directional couplers. At 1006, power of RF signals reflected from the load is measured, such as via the one or more directional couplers.

At 1008, temperature of the load is determined based on the measured power of RF signals transmitted to the load and the measured power of RF signals reflected from the load. In some examples, the reflection coefficient is calculated from the measured power of RF signals transmitted to the load and the measured power of RF signals reflected from the load at 1012 and the temperature is determined based on that calculated reflection coefficient, such as by determining the temperature that corresponds to the calculated reflection coefficient (e.g., FIG. 10). At 1010, the power of RF signals transmitted to the load is adjusted to maintain the determined temperature at a predetermined temperature, which may, for example, be within a Curie point transition range. In some examples, the power of RF signals transmitted to the load is adjusted to maintain a reflection coefficient that corresponds to the predetermined temperature.

Method 1000 may include one or more additional steps, such as at least substantially reducing or cancelling out positive reactance of the load via, for example, a load capacitor. Additionally, or alternatively, method 1000 may include a step of absorbing at least a substantial portion of the RF signals from the load, such as via an attenuator. Although FIG. 11 shows particular steps for method 1000, other examples of the method may add, omit, replace, repeat, and/or modify one or more steps. Additionally, the steps shown in FIG. 11 may be performed in any suitable order and two or more steps may be performed concurrently or simultaneously.

The RF heating apparatuses and methods of the present disclosure use the ratio of incident and reflected power waves (which can be converted into the ratio of the incident and reflected voltage waves) and provides various benefits over prior art RF heating apparatuses and methods. First, the RF heating apparatuses and methods of the present disclosure does not require for a specific length of interconnect because the ratio of the incident and reflected power waves is constant regardless of the distance between the measurement circuit and the load. Second, calculating the reflection coefficient of the load provides increased precision in determining temperature in the Curie point transition range. Finally, the RF heating apparatuses and methods of the present disclosure allows for temperature control both above and below the Curie point.

Example Features: This section describes additional aspects and features of the apparatuses and methods for rapid heating of magnetic materials with the ability to precisely control the operating temperature of the material, presented without limitation as a series of paragraphs, some or all of which may be alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing, without limitation, examples of some of the suitable combinations.
  A. An apparatus for precision temperature control, the apparatus comprising:
     a radio frequency power source;
     an amplifier;
     an attenuator;
     a directional coupler, wherein the directional coupler has a first coupled port that samples the incident power wave and a second coupled port that samples the reflected power wave from the load;
     and a feedback loop, wherein the feedback loop has a first and second detector and the loop compares the incident power wave to the reflected power wave.
  A1. The apparatus of paragraph A, wherein the feedback loop further converts the incident and reflected power waves into incident and reflected voltages or currents.
  A2. The apparatus of paragraph A1, wherein the feedback loop further compares the voltages with a reference and outputs a control voltage.
  B. A method for precision temperature control, the method comprising:
     supplying a radio frequency signal that generates an output power;
     amplifying and adjusting the output power;
     reflecting a portion of the output power back;
     drawing a portion of the output power;
     sampling the drawn and reflected power waves; and
     comparing the drawn and reflected power waves.
  B1. The method of paragraph B, further comprising comparing the ratio of the drawn and reflected power waves.

It will be appreciated that the invention is not restricted to the particular embodiment that has been described, and that variations may be made therein without departing from the scope of the invention as defined in the appending claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

What is claimed is:

1. A heating apparatus for heating a load having at least one magnetic material, comprising:
   a source of radio frequency (RF) signals;
   a power management assembly that receives the RF signals and that increases or decreases power of the RF signals;
   at least one directional coupler that measures power of the RF signals received from the power management assembly and power of the RF signals reflected from the load to the at least one directional coupler; and
   a control assembly operable to:
     receive the measured power of the RF signals received from the power management assembly and the measured power of the RF signals reflected from the load,
     determine a temperature of the load based on the measured power of the RF signals received from the power management assembly and the measured power of the RF signals reflected from the load, and
     send one or more control signals to the power management assembly instructing the power management assembly to increase or decrease power of the RF signals received from the source of RF signals to maintain the determined temperature of the load at a predetermined temperature,
   wherein the control assembly includes:
     a first power detector that converts a portion of the RF signals from the power management assembly into a first voltage;
     a second power detector that converts a portion of the RF signals reflected from the load to the at least one directional coupler into a second voltage;
     a comparator that compares the first and second voltages and generates an output voltage based on comparing the first and second voltages;
     a low pass RC filter that receives the output voltage from the comparator; and
     an amplifier that amplifies the output voltage from the low pass RC filter, the output voltage from the amplifier being the one or more control signals.

2. The heating apparatus of claim 1, wherein the control assembly is further operable to:
   calculate a reflection coefficient from the received measured power of the RF signals received from the power management assembly and the received measured power of the RF signals reflected from the load; and
   send one or more control signals to the power management assembly instructing the power management assembly to increase or decrease power of the RF signals received from the source of RF signals to maintain a reflection coefficient that corresponds to the predetermined temperature.

3. The heating apparatus of claim 1, wherein the power management assembly includes at least one of an attenuator or an amplifier.

4. The heating apparatus of claim 1, further comprising at least one load capacitor that at least substantially reduces positive reactance of the load.

5. The heating apparatus of claim 1, further comprising an attenuator that absorbs at least a substantial portion of the RF signals reflected from the load, wherein the at least one directional coupler is disposed between the attenuator and the load.

6. The heating apparatus of claim 1, wherein the at least one directional coupler includes two single directional couplers.

7. The heating apparatus of claim 1, wherein the at least one directional coupler includes a forward directional coupler and a reverse directional coupler, the forward directional coupler measures power of the RF signals received from the power management assembly, and the reverse directional coupler measures power of the RF signals reflected from the load.

8. The heating apparatus of claim 1, wherein the at least one directional coupler includes a transformer coupler.

9. A method of heating a load having at least one magnetic material via radio frequency (RF) signals, comprising:
   transmitting RF signals to heat the load;
   measuring power of the RF signals transmitted to the load;
   measuring power of RF signals reflected from the load;

determining a temperature of the load based on the measured power of the RF signals transmitted to the load and the measured power of RF signals reflected from the load; and adjusting power of the RF signals transmitted to the load to maintain the determined temperature at a predetermined temperature, wherein adjusting power of the RF signals includes:

converting a portion of the transmitted RF signals into a first voltage, converting a portion of the reflected RF signals into a second voltage, comparing the first and second voltages, generating an output voltage based on comparing the first and second voltages, receiving the generated output voltage, and adjusting the power of the RF signals transmitted to the load to maintain the determined temperature at the predetermined temperature via the received output voltage.

10. The method of claim 9, further comprising calculating a reflection coefficient from the measured power of the RF signals transmitted to the load and the measured power of RF signals reflected from the load, wherein adjusting power of the RF signals transmitted to the load to maintain the determined temperature at a predetermined temperature includes adjusting power of the RF signals transmitted to the load to maintain a reflection coefficient that corresponds to the predetermined temperature.

11. The method of claim 9, wherein the predetermined temperature is within a Curie point transition range in which the at least one magnetic material transitions between ferromagnetic and paramagnetic phases.

12. The method of claim 9, further comprising at least substantially reducing positive reactance of the load.

13. The method of claim 9, absorbing at least a substantial portion of the RF signals reflected from the load.

14. The method of claim 9, wherein adjusting power of the RF signals transmitted to the load further includes amplifying the received output voltage and adjusting the power of the RF signals transmitted to the load to maintain the determined temperature at the predetermined temperature via the amplified output voltage.

* * * * *